US009437509B2

(12) United States Patent
Osawa et al.

(10) Patent No.: US 9,437,509 B2
(45) Date of Patent: Sep. 6, 2016

(54) PACKAGE FOR ELECTRONIC COMPONENTS SUPPRESSING MULTIPACTOR DISCHARGE

(71) Applicant: SUMITOMO ELECTRIC DEVICE INNOVATIONS, INC., Yokohama-shi, Kanagawa (JP)

(72) Inventors: Ken Osawa, Yokohama (JP); Harutoshi Saigusa, Yokohama (JP)

(73) Assignee: SUMITOMO ELECTRIC DEVICE INNOVATIONS, INC., Yokohama-Shi, Kanagawa (JP)

( * ) Notice: Subject to any disclaimer, the term of this patent is extended or adjusted under 35 U.S.C. 154(b) by 0 days.

(21) Appl. No.: 14/673,328

(22) Filed: Mar. 30, 2015

(65) Prior Publication Data
US 2015/0282357 A1  Oct. 1, 2015

(30) Foreign Application Priority Data

Mar. 31, 2014  (JP) ................. P2014-071282

(51) Int. Cl.
*H01L 23/48* (2006.01)
*H01L 23/047* (2006.01)

(52) U.S. Cl.
CPC .......... *H01L 23/047* (2013.01); *H01L 23/481* (2013.01); *H01L 2224/48091* (2013.01); *H01L 2224/73265* (2013.01); *H01L 2924/16195* (2013.01)

(58) Field of Classification Search
CPC ..................................................... H01L 23/481
USPC .................... 257/698, 699, 708; 174/551
See application file for complete search history.

(56) References Cited

U.S. PATENT DOCUMENTS

| 4,451,540 | A | * | 5/1984 | Baird | B23K 1/19 174/535 |
| 4,649,229 | A | * | 3/1987 | Scherer | H05K 5/0091 174/551 |
| 5,293,069 | A | * | 3/1994 | Kato | H01L 23/04 257/691 |
| 5,528,079 | A | * | 6/1996 | McIver | H01L 23/057 257/698 |
| 5,700,724 | A | * | 12/1997 | Shipe | H01L 23/057 257/698 |
| 5,750,926 | A | * | 5/1998 | Schulman | A61N 1/3754 174/564 |
| 5,792,984 | A | * | 8/1998 | Bloom | H01L 23/10 174/536 |
| 5,880,403 | A | * | 3/1999 | Czajkowski | H01L 23/055 174/387 |
| 6,204,448 | B1 | * | 3/2001 | Garland | H01L 23/66 174/541 |
| 6,242,694 | B1 | * | 6/2001 | Muraki | H05K 5/0095 174/551 |
| 6,489,677 | B2 | * | 12/2002 | Okada | H01L 27/14618 257/433 |
| 6,867,367 | B2 | * | 3/2005 | Zimmerman | H01L 21/50 174/528 |
| 7,446,411 | B2 | * | 11/2008 | Condie | H01L 23/047 257/710 |

FOREIGN PATENT DOCUMENTS

JP   H6-013513   1/1994

* cited by examiner

*Primary Examiner* — Hung V Ngo
(74) *Attorney, Agent, or Firm* — Smith, Gambrell & Russell, LLP.

(57) ABSTRACT

A package for electronic components that suppresses multipactor discharge is disclosed. The package includes a metal base and a casing. The metal base provides a pocket in the side thereof. The casing, mounted on the metal base to surround electronic components therein, provides a lead terminal connecting the electronic components to the outside and a feedthrough to isolate the lead terminal from the metal base. The pocket in the metal base is positioned beneath the lead terminal with an insulator therebetween.

13 Claims, 5 Drawing Sheets

PACKAGE FOR ELECTRONIC COMPONENTS SUPPRESSING MULTIPACTOR DISCHARGE

BACKGROUND OF THE INVENTION

1. Field of the Invention

The present invention relates to a package for electronic components.

2. Background Arts

Electronic components such as semiconductor devices, capacitors, and so on are enclosed within a package of an electronic device. The electronic components are mounted on a metal base comprising the package and enclosed air-tightly by a casing and a lid surrounding and covering the electronic components. Lead terminals, which electrically connect the electronic components within the package to the outside, pass through the casing also mounted on the metal base as putting insulating feedthrough against the metal base to be electrically isolated from the base.

In an application of the electronic device, namely, putting the electronic device in a high vacuum and inputting/outputting a high frequency signal having extremely large power to/from the electronic components through the lead terminals, a vacuum discharge called as the multipactor discharge possibly occurs between the lead terminal and the metal base. When the high frequency signal is constant in the frequency and the power thereof, the possibility to induce the multipactor discharge depends on a distance between the lead terminal and the metal base. One prior document has reported to take a distance from the lead terminal to the metal base longer than 1 mm. However, the feedthrough put between the lead terminal and the metal base usually determines the distance therebetween, and a thicker feedthrough possibly brings the failure of the air-tightness of the package.

SUMMARY OF THE INVENTION

An aspect of the present invention relates to a package for enclosing electronic components of field effect transistors (FET), capacitors, inductors, and so on therein. The package comprises a base, a casing and feedthrough. The base may be made of metal and has a top surface for mounting the casing and the electronic components thereon. The casing surrounds the electronic components therein air-tightly. The feedthrough, which includes an insulator and a conductive pattern provided on the insulator, passes through the casing to input a signal into the electronic components and to output another signal from the electronic components. A lead terminal is fixed to the conductive pattern in an outside of the casing. A feature of the package of the present invention is that the base provides a pocket cut from an edge and positioned beneath the feedthrough. The cut preferably has a width perpendicular to the lead terminal greater than or equal to a width of the feedthrough perpendicular to the lead terminal.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some preferred embodiments of the present invention will be described as referring to accompanying drawings. In the description of the drawings, numerals or symbols same with or similar to each other will refer to elements same with or similar to each other without duplicating explanations.

Figure 1:
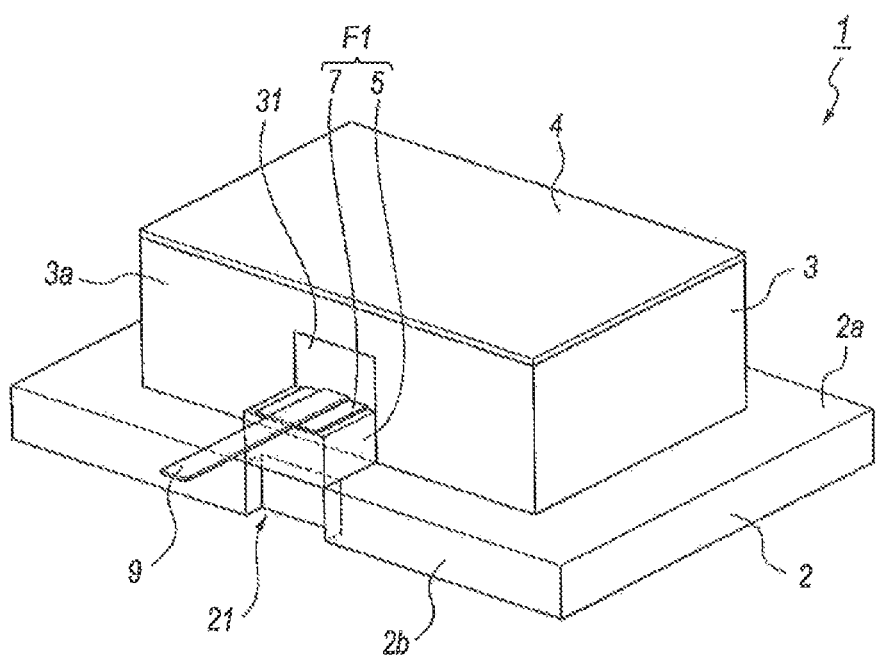
FIG. 1 is a perspective view of a package according to an embodiment of the present invention.
Figure 2A:
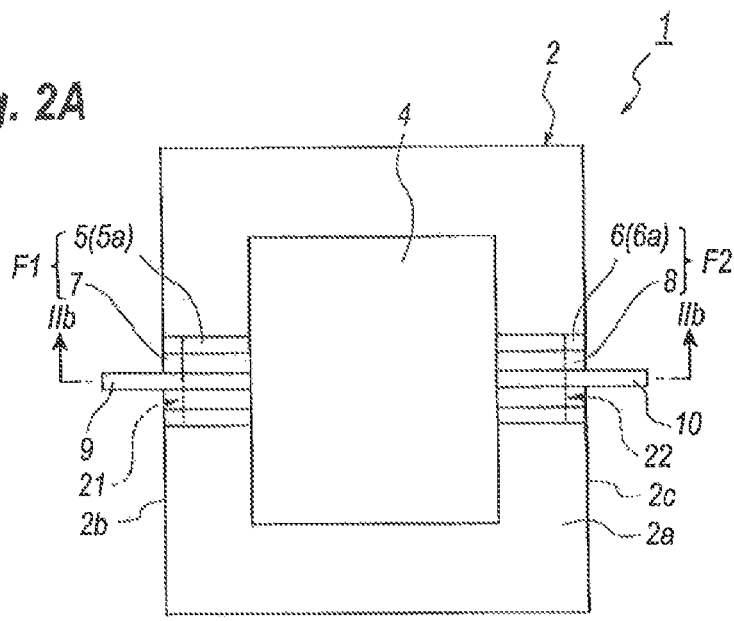
FIG. 2A is a plan view of the package shown in FIG. 1.
Figure 2B:
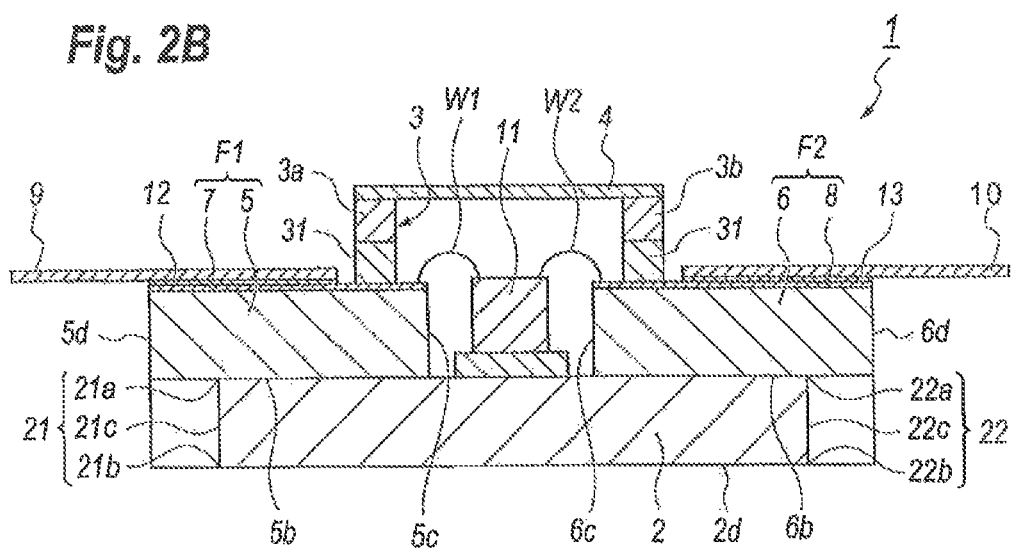
FIG. 2B is a cross section of the package taken along the line IIb-IIb appearing in FIG. 2A.

FIG. 1 is a perspective view of a package for electronic devices, FIG. 2A is a plan view of the package, and FIG. 2B shows a cross section taken along the line IIb-IIb appearing in FIG. 2A. As shown in FIGS. 1 to 2B, the package 1 primarily includes a base 2, a casing 3, a feedthrough, F1 and F2, lead terminals, 9 and 10, and a lid 4. The base 2, the casing 3, and the lid 4 form a space into which electronic components 11 are air-tightly enclosed. The electronic components 11 include semiconductor devices, capacitors, and so on. The semiconductor devices may be a high electron mobility transistor (HEMI) made of nitride semiconductor materials capable of outputting the extremely high power of 100 to 200 W. The feedthrough, F1 and F2, each includes an insulator, 5 and 6, and a conductive pattern, 7 and 8, provided on respective insulators, 5 and 6.

The base 2, which is made of metal of a rectangular slab, is electrically grounded. Specifically, the base 2 may be made of copper (Cu), alloy or composite metal primarily containing copper (Cu) having a surface plated with multi-layered metal of titanium (Ti), nickel (Ni), and gold (Au). The explanation below assumes that the longitudinal direction is along to the direction where the lead terminals, 9 and 10, are brought out from the casing 3, and the lateral direction is perpendicular to the longitudinal direction. In the present embodiment, the base 2 has a primary surface 2a thereof with dimensions of 2 to 30 mm along the longitudinal direction and 5 to 40 mm along the lateral direction. Also, the base 2 has a thickness of 0.2 to 2 mm. The base 2 may have square planar dimensions or rectangle dimensions.

The casing 3, which is mounted on the base 2, surrounds the electronic components 11. The casing 3 also has a rectangular plane shape with sides extending in parallel to respective sides of the base 2. The casing 3 may be made of metal or alloy, for instance, an alloy of iron (Fe), cobalt (Co), nickel (Ni), which is called as Kovar, or ceramic such as alumina ($Al_2O_3$), zirconia ($ZrO_2$), titania ($TiO_2$), and so on. The casing 3 may have dimensions of 0.5 to 5 mm in height, 2 to 30 mm along the lateral and the longitudinal directions. The casing 3 includes insulating portions 31 in respective sides, 3a and 3b. The insulating portions 31 electrically isolate respective conductive patterns, 7 and 8, from the metallic sides, 3a and 3b.

The lid 4, which is put on the casing 3 and has a rectangular plane shape, seam-seals the space surrounded by the casing 3 and the base 2 air-tightly. The lid 4 of the present embodiment is made of metal, but the lid 4 may be made of ceramic.

The insulators, 5 and 6, of respective feedthrough, F1 and F2, each has a rectangular parallelepiped, pass through respective sides, 3a and 3b, of the casing 3. The insulators, 5 and 6, of feedthrough, F1 and F2, each has a height of 0.2 to 2 mm, and is made of ceramics.

The conductive patterns, 7 and 8, are provided on the top surfaces, 5a and 6a, of respective insulators, 5 and 6, and pass through the casing 3. Specifically, the conductive patterns, 7 and 8, electrically connect the electrical components 11 enclosed within the casing 3 to other electronic apparatuses outside of the casing 3. The conductive patterns, 7 and 8, may be made of stacked metals of titanium (Ti), nickel (Ni), and gold (Au), formed by the sputtering and/or the vacuum evaporation of those metals, where titanium (Ti) is in contact with the insulators, 5 and 6. The conductive patterns, 7 and 8, in an alternate may be an alloy containing those metals.

The lead terminals, 9 and 10, which are provided on the insulators, 5 and 6, are electrically connected to the electronic components 11 enclosed in the casing 3 through the conductive patterns, 7 and 8, the brazing metals, 12 and 13, and the bonding wires, W1 and W2, respectively. The brazing metals, 12 and 13, between the lead terminals 9 and 10, and the conductive patterns, 7 and 8, not only electrically connect them but rigidly fix the lead terminals, 9 and 10, on the conductive patterns, 7 and 8, respectively. Thus, the lead terminals, 9 and 10, are not peeled off from the conductive patterns, 7 and 8. The lead terminals, 9 and 10, may be made of copper (Cu), nickel (Ni), or titanium (Ti), or an alloy containing those metals plated with gold (Au). The brazing metals, 12 and 13, are an alloy of silver (Ag), copper (Cu) and zinc (Zn), which is often called as a silver solder. In the electronic device of the present embodiment, the lead terminal 9 is the input terminal, and, the other lead terminal 10 is the output terminal.

A feature of the base 2 of the present embodiment is that the base 2 provides pockets, 21 and 22, in respective sides, 2b and 2c, each extending along the lateral direction. The pocket 21 overlaps with the lead terminal 9 and the conductive pattern 7 as interposing the insulator 5. The pocket 21 may have a width along the lateral direction wider than a width of the lead terminal 9. In the present embodiment, the width of the pocket 21 is substantially equal to a width of the feedthrough F1. In the pocket 21, a top end 21a thereof matches with the bottom surface 5b of the insulator 5. On the other hand, the bottom end 21b thereof matches with the bottom 2d of the base 2. That is, the pocket 21 extends from the bottom 2d to the primary surface 2a of the base 2. The deep end 21c of the pocket 21 is positioned outside of the outer surface of the insulating portion 31. That is, the pocket 21 is not overlapped with the whole of the lead terminal 9, but overlapped only with a portion close the outer side 5d of the insulator 5.

The other lead terminal 10 has positional relations against the pocket 22 similar to the relation between the lead terminal 9 and the pocket 21. That is, the pocket 22 is overlapped with the lead terminal 10 and the conductive pattern 8 as interposing the insulator 6 therebetween. The pocket 22 may have a width along the lateral direction greater than or equal to a width of the lead terminal 10. The present embodiment has the pocket 22 whose width is substantially equal to the width of the feedthrough F2. The top end 22a matches with the top of the base 2 and the bottom surface 6b of the insulator 6. The bottom end 22b matches with the bottom 2d of the base 2. That is, the pocket 22 is formed in the side 2c as fully removing a portion of the base 2 from the bottom 2d to the primary surface 2a. The deep end 22c of the pocket 22 is positioned outside of the outer surface of the insulating portion 31. That is, the pocket 22 is not overlapped with the whole of the lead terminal 10 but a portion close to the outer side 6d of the insulator 6. Thus, two pockets, 21 and 22, have a shape same to each other. However, the pockets may have respective shape different from the other.

Figure 3A:
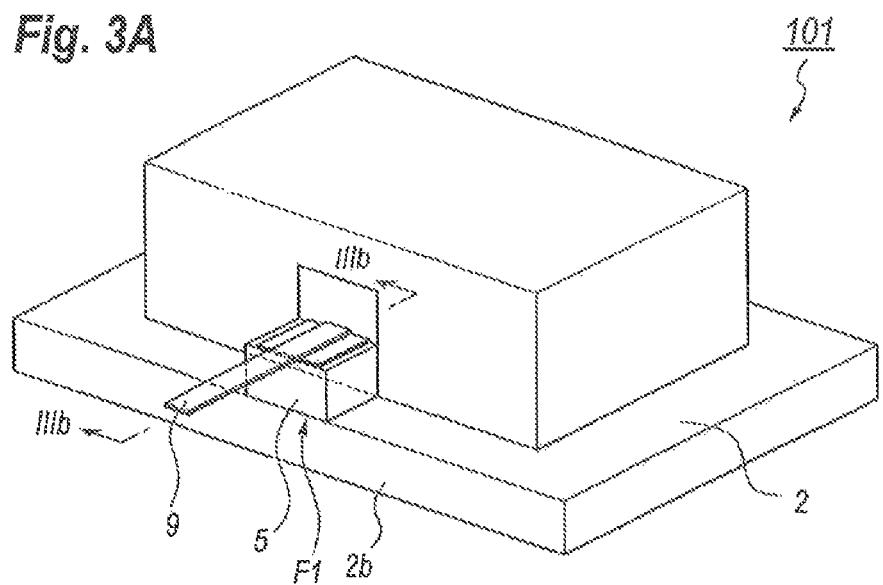
FIG. 3A is a perspective view of a package comparable to that shown in FIG. 1 of the present invention.
Figure 3B:
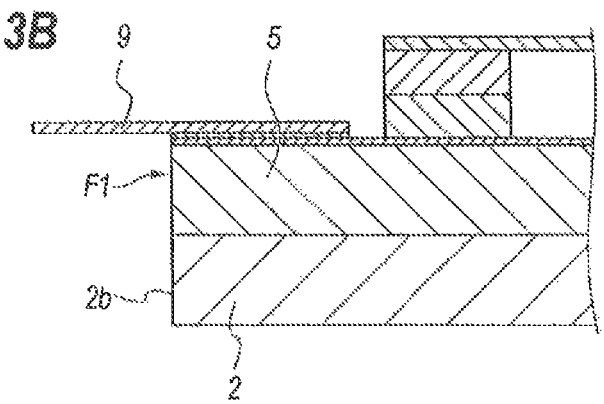
FIG. 3B is a cross section thereof taken along the line IIIb-IIIb indicated in FIG. 3A.

An advantage of the package 1 according to the present invention will be described as comparing the package 1 with a comparable example. FIG. 3A is a perspective view showing a comparable example, and FIG. 3B is a cross section taken along the line IIIb-IIIb appearing in FIG. 3A. The base 2 of the comparable example does not have any pockets in the side 2b thereof, which means that a distance from the lead terminal 9 to the side 2b of the base 2 along the surface of the insulator 5 becomes identical with the thickness of the feedthrough F1. In such a case, the lead terminal 9 possibly induces the multipactor discharge between the lead terminal 9 and the side 2b of the base 2.

On the other hand, the package 1 of the present embodiment, as shown in FIGS. 1 to 2B, provides the pocket 21 in the side 2b and another pocket 22 in the side 2c. Each of the pockets, 21 and 22, forms a hollow along the longitudinal direction of the base 2 from respective sides, 2b and 2c, thereof. This arrangement may expand a distance from the lead terminal 9 to the side 2b and another distance from the lead terminal 10 to the side 2c, respectively along the surface of the insulators, 5 and 6. Thus, the multipactor discharge may be effectively prevented.

Figure 4A:
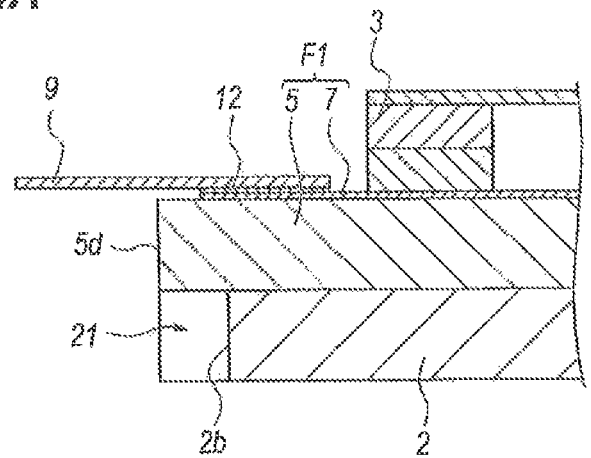
FIG. 4A is a cross section of a package modified from that shown in FIG. 1.
Figure 4B:
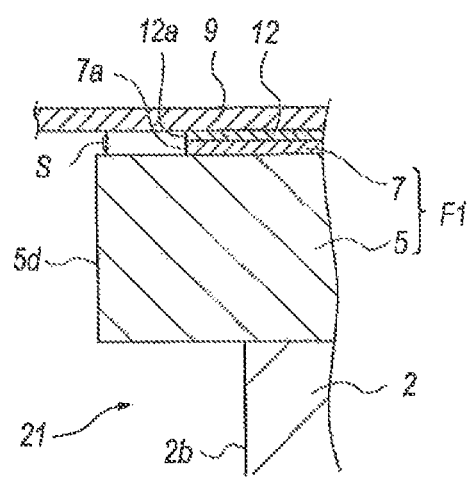
FIG. 4B magnifies a portion of that shown in FIG. 4A.

FIG. 4A is a cross section of the package according to a modified example, and FIG. 4B magnifies a portion close to the outer side 5d of the insulator 5. As shown in FIGS. 4A and 4B, the brazing metal 12 in the outer edge 12a thereof is retreated from the edge of the outer side 5d and the conductive pattern 7 in the outer edge 7a thereof is also retreated from the edge of the outer side 5d of the insulator 5. This arrangement of the lead terminal 9, the brazing metal 12, the conductive pattern 7, and the insulator 5 form a gap S between the lead terminal 9 and the insulator 5 in an outside of the brazing metal 12 and the conductive pattern 7. Thus, the conductive materials of the lead terminal 9, namely, the brazing metal 12 and the conductive pattern 7, become further apart from the side 2b of the base 2 along the surface of the insulator 5, which effectively suppresses the multipactor discharge between the lead terminal 9 and the base 2.

Figure 5:
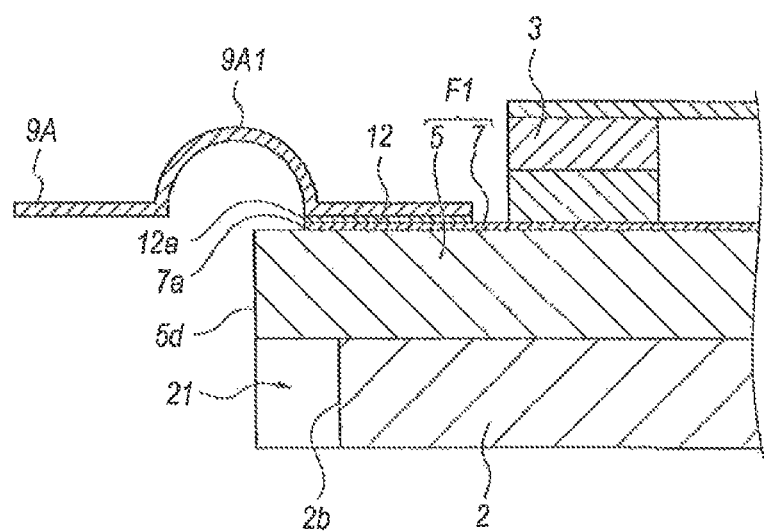
FIG. 5 is a cross section of a package according to the second modification of the embodiment shown in FIG. 1.

FIG. 5 is a cross section of the package according to still another modification of the present invention. The lead terminal 9A of the present modification has a portion 9A1 curved upward at the end of the outer side 5d of the insulator 5. That is, the lead terminal 9A in the portion 9A1 thereof has the reversed U-shape by bending the lead terminal 9A upward at the outer edges, 7a and 12a, of the conductive pattern 7 and the brazing metal 12, forming the reversed U-shape, and bending again at a point whose horizontal level is substantially equal to the top of the insulator 5. This arrangement of the lead terminal 9A may expand the gap S in the forgoing modification shown in FIGS. 4A and 4B, where the foregoing arrangement leaves possibility to induce the multipactor discharge between the lead terminal 9 and the base 2 because the gap S in a length thereof is merely equal to the overall thickness of the brazing metal 12 and the conductive pattern 7. On the other hand, the lead terminal 9A of the present modification is apart from the edge of the insulator 5, which further effectively suppresses the multipactor discharge. Although the explanation above concentrates on the lead terminal 9A for the signal input, the other lead terminal 10 for the signal output may have the arrangement same with those described above.

The package according to the present invention may have arrangements not restricted to those described above, and the package may have an arrangement combining the embodiment and the modifications described above. For instance, the package has the arrangement of the first modification shown in FIG. 4A for the input lead terminal 9, but the second modification shown in FIG. 5 for the output lead terminal 10. Also, the description above concentrates the base 2 made of metal, but the base 2 may be made of insulating material coated with metal.

Moreover, the pockets, 21 and 22, in the plane shape thereof is not restricted to be a rectangle; but a semi-circular plane shape with the root of the lead terminal 9 as the center thereof may be applicable. Also, the bottom end 21b of the pocket 21 is unnecessary to match with the bottom 2d thereof. The pocket 21 may be a hollow with the top end 21a coinciding with the top of the base 2 but the bottom end 21b is intermediate in the thickness of the base 2.

Thus, the present embodiments and the modifications of the invention should be considered in all respects as illustrative and not restrictive. Accordingly, the scope of the invention is determined by the appended claims and their equivalents.

We claim:

1. A package for enclosing electronic components, comprising:
   an electrically conductive base having a top surface that mounts the electronic components thereon;
   a casing provided on the top surface of the base, the casing surrounding the electronic components therein; and
   a feedthrough including an insulator and a conductive pattern formed on the insulator, the feedthrough passing through the casing,
   wherein the base provides a pocket cut from an edge thereof the pocket being positioned beneath the feedthrough.

2. The package of claim 1,
   further comprising a lead terminal extending outward from the conductive pattern in a portion outside of the casing, wherein the pocket has a width perpendicular to a direction of the lead terminal wider than or equal to a width of the insulator perpendicular to the lead terminal.

3. The package of claim 2,
   wherein the conductive pattern has an outer edge retreated from an outer edge of the insulator, and the lead terminal forms a gap against the insulator at a portion where the conductive pattern is retreated.

4. The package of claim 3,
   wherein the lead terminal has a reversed U-shape curved upwardly at the outer edge of the insulator.

5. The package of claim 2,
   wherein the lead terminal is fixed to the conductive pattern with brazing metal.

6. The package of claim 2,
   wherein the lead terminal has a width perpendicular to the lead terminal narrower than a width of the conductive pattern perpendicular to the lead terminal, and the width of the conductive pattern is narrower than the width of the insulator.

7. The package of claim 1,
   wherein the conductive pattern has an outer edge aligned with an outer edge of the insulator.

8. The package of claim 1,
   wherein the base provides a bottom surface opposite to the top surface, the pocket being cut from the bottom surface to the top surface.

9. The package of claim 8,
   wherein the pocket provides a top end, a bottom end, and a deep end, the top end matching with the top surface of the base, the bottom end matching with the bottom surface of the base, and the deep end being in a position corresponding to the position on the top surface of the base outside from the casing.

10. The package of claim 1,
    wherein the casing is made of metal.

11. The package of claim 10,
    wherein the feedthrough has another insulator surrounding the conductive pattern accompanied with the insulator at the casing.

12. The package of claim 1,
    wherein the electronic components include a field effect transistor (FET) including nitride semiconductor materials, the FET outputting a high frequency signal with power exceeding 100 W.

13. The package of claim 1,
    wherein the insulator is made of ceramics.

* * * * *